(12) United States Patent
Bois et al.

(10) Patent No.: US 6,873,162 B1
(45) Date of Patent: Mar. 29, 2005

(54) SYSTEM AND METHOD FOR DETERMINING A DIELECTRIC PROPERTY ASSOCIATED WITH A SUBSTRATE

(75) Inventors: Karl Joseph Bois, Fort Collins, CO (US); David W. Quint, Fort Collins, CO (US); Michael Tsuk, Arlington, MA (US); Brian Kirk, Amherst, NH (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/701,544

(22) Filed: Nov. 5, 2003

(51) Int. Cl.[7] .......................... G01R 27/04; G01N 27/00
(52) U.S. Cl. ...................... 324/638; 324/71.1; 324/605; 324/158.1
(58) Field of Search .......................... 428/312.6, 313.9; 385/2–8; 716/2–6; 324/638, 605, 71.1, 73.1, 76.11, 76.12, 537, 765, 158.1; 257/621, E21.521, E21.525

(56) References Cited

U.S. PATENT DOCUMENTS

| | | | |
|---|---|---|---|
| 5,477,137 A | * 12/1995 | Staudinger et al. ...... | 324/158.1 |
| 5,566,257 A | * 10/1996 | Jaeger et al. ................... | 385/2 |
| 6,106,567 A | 8/2000 | Grobman et al. ............. | 716/5 |
| 6,320,401 B1 | * 11/2001 | Sugimoto et al. ........... | 324/765 |
| 6,562,448 B1 | * 5/2003 | Chamberlain et al. ... | 428/312.6 |
| 2002/0180004 A1 | 12/2002 | Oggioni et al. ............. | 257/621 |

OTHER PUBLICATIONS

Karl J. Bois, Brian Kirk, Michael Tsuk and David Quint; "Simple and Accurate Determination of Complex Permittivity and Skin Effect of FR4 Material in Gigahertz Regime"; Proceedings of the 53rd Electronic Components and Technology Conference; pp. 1277–1282; New Orleans, LA; May 27–30, 2003.

Ari H. Sihvola and Jin Au Kong; "Effective Permittivity of Dielectric Mixtures"; IEEE Transactions of Geoscience and Remote Sensing, vol. 26, No. 4, Jul. 1988; pp. 420–429.

Micheal D. Janezic and Jeffrey A. Jargon; "Complex Permittivity Determination from Propagation Constant Measurements"; IEEE Microwave and Guided Wave Letters, vol. 9, No. 2, Feb. 1999; pp. 76–78.

Mike Graboise; "Understanding losses is key to state–of–t–he–art interfacing"; EETimes; Feb. 19, 2003; http://www.ee-times.com/printableArticle?doc_id=OEG20030219S0044; 9 pages.

* cited by examiner

*Primary Examiner*—Vincent Q. Nguyen

(57) ABSTRACT

A system and method for determining the dielectric properties associated with a substrate. In one embodiment, a network analyzer measures scattering parameters for at least two lines of substantially identical cross-section embedded within the substrate over a specified frequency range. A first engine determines a complex propagation constant based on the scattering parameters and defines the complex propagation constant in terms of an attenuation component and a phase component. A second engine, responsive to the phase component, determines a relative permittivity parameter associated with the substrate over the specified frequency range. A third engine, responsive to the attenuation component and the relative permittivity parameter, performs a least squares analysis to determine a loss tangent parameter associated with the substrate over the specified frequency range.

23 Claims, 5 Drawing Sheets

SYSTEM AND METHOD FOR DETERMINING A DIELECTRIC PROPERTY ASSOCIATED WITH A SUBSTRATE

CROSS-REFERENCE TO RELATED APPLICATION(S)

This application discloses subject matter related to the subject matter disclosed in the following commonly owned co-pending patent application(s): (i) "SYSTEM AND METHOD FOR SPECIFYING A DIELECTRIC PROPERTY OF A SUBSTRATE UNDER DESIGN," filed Nov. 5, 2003, application Ser. No. 10/701,546, in the names of: Karl Joseph Bois, David W. Quint and Timothy L. Michalka; and (ii) "SYSTEM AND METHOD FOR DETERMINING A DIELECTRIC PROPERTY ASSOCIATED WITH A CONSTITUENT MATERIAL OF A COMPOSITE SUBSTRATE," filed Nov. 5, 2003, application Ser. No. 10/702,168, in the names of: Karl Joseph Bois, David W. Quint, Timothy L. Michalka and Peter Shaw Moldauer, both of which are hereby incorporated by reference for all purposes.

BACKGROUND

In recent years, the computer industry has strived to introduce system links that operate in the gigahertz regime. Due to the increase in data bandwidth and decrease in voltage margin, the attenuation and distortion caused by the channel is of much more concern than in past system generations. Hence, for successful modeling and design of signal interconnects, it is critical to determine the frequency variations of the dielectric characteristics of the signal channel, especially their frequency-dependent losses. As such, the accurate knowledge of electric properties of chip packaging and printed circuit board (PCB) materials is required.

For example, in PCBs, a widely used material is what is commonly referred to as Fire Retardant (FR)-4 material, which is relatively less expensive. FR4 is a material formed by glass strands embedded in an epoxy resin binder. Counter to its low cost benefit, the material exhibits noticeable attenuation at higher frequencies, for example at frequencies greater than 1 GHz. These losses are associated with the loss tangent of the material, wherein the complex dielectric constant, $\epsilon_r$, of the material varies by frequency and may be expressed by the following equation:

$$\epsilon_r = \epsilon'_r - j\epsilon''_r, \text{ wherein}$$

$\epsilon'_r$ is the relative permittivity of the material which varies as a function of frequency; and $\epsilon''_r$ is the loss factor of the material which varies as a function of frequency.

Loss tangent, tan δ, may be defined by the following equation in terms of the relative permittivity, $\epsilon'_r$, and the loss factor, $\epsilon''_r$:

$$\tan \delta = \epsilon''_r / \epsilon'_r$$

Unfortunately, when modeling transmission lines embedded in FR4, data supplied by most manufacturers for this parameter is usually measured at relatively low frequencies, for example, 60 Hz or 100 MHz. On the other hand, existing measurement techniques such as coaxial or waveguide techniques are not only impractical for in-situ measurements, they are generally inadequate for capturing higher-order effects. Hence, a method for measuring the dielectric properties, such as the dielectric constant and loss tangent, of this material and other materials in the gigahertz regime is needed.

SUMMARY

A system and method are disclosed that provide for determining the dielectric properties associated with a substrate. In one embodiment, a network analyzer measures scattering parameters for at least two lines of substantially identical cross-section embedded within the substrate over a specified frequency range. A first engine determines a complex propagation constant based on the scattering parameters and defines the complex propagation constant in terms of an attenuation component and a phase component. A second engine, responsive to the phase component, determines a relative permittivity parameter associated with the substrate over the specified frequency range. A third engine, responsive to the attenuation component and the relative permittivity parameter, performs a least squares analysis to determine a loss tangent parameter associated with the substrate over the specified frequency range.

DETAILED DESCRIPTION OF THE DRAWINGS

Figure 1:
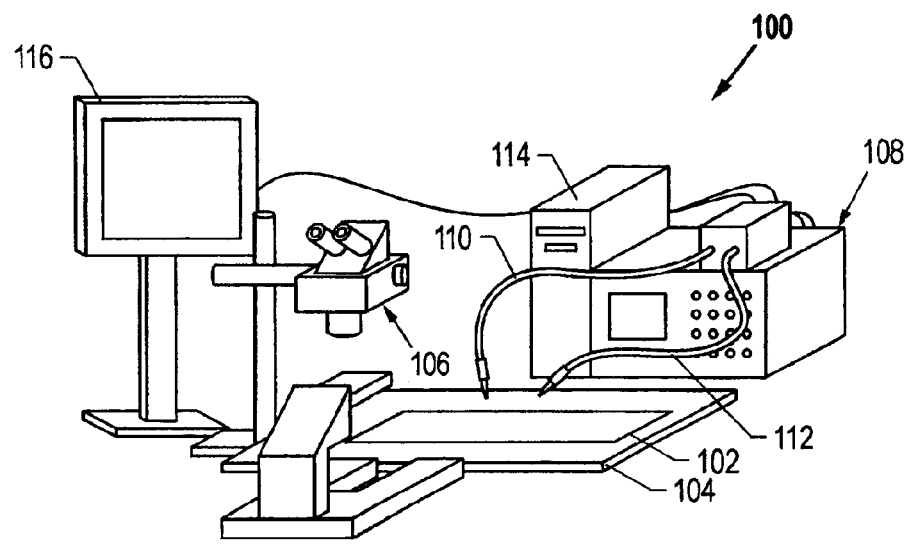
FIG. 1 depicts a schematic diagram of one embodiment of a system for analyzing a substrate.

In the drawings, like or similar elements are designated with identical reference numerals throughout the several views thereof, and the various elements depicted are not necessarily drawn to scale. Referring now to FIG. 1, therein is depicted an embodiment of a system 100 for analyzing a substrate, which is illustrated as a printed circuit board (PCB) 102. A work surface 104 supports the PCB 102 and provides a physical area where an engineer can interact with the PCB 102. A microscope assembly 106 is utilized by the engineer to enlarge the minute elements, such as plated through holes (PTHs) and microstrips, of the PCB 102 by way of one or more optical lenses. A network analyzer 108 derives the electrical properties of the PCB 102 using probes 110 and 112 which provide coupling to the PCB 102. In particular, probes 110 and 112 inject or extract energy relative to the PCB 102 in order to measure various electrical parameters such as a standing wave-ratio or scattering parameters. A computer 114 is associated with network analyzer 108, or may be integrated therewith, to receive and process the measurements and data collected by network analyzer 108. A monitor 116 is positioned in communication with the computer 114 and presents the raw and processed measurements to the engineer via a display.

In operation, as will be explained in more detail hereinbelow, the probes 110, 112 coupled to the network analyzer 108 enable in-situ scattering parameter measurements for at least two lines of substantially identical cross-section embedded within the PCB 102 over a specified frequency range. The network analyzer 108, responsive to the in-situ measured scattering parameters, determines the relative permittivity, $\epsilon'_r$, and loss tangent, tan δ, associated with the PCB 102 by utilizing a complex propagation constant and a cascade representation of uniform transmission to model the PCB 102. The loss tangent, in turn, may be employed to determine the complex permittivity, $\epsilon_r$, of the material, for example.

Figure 2:
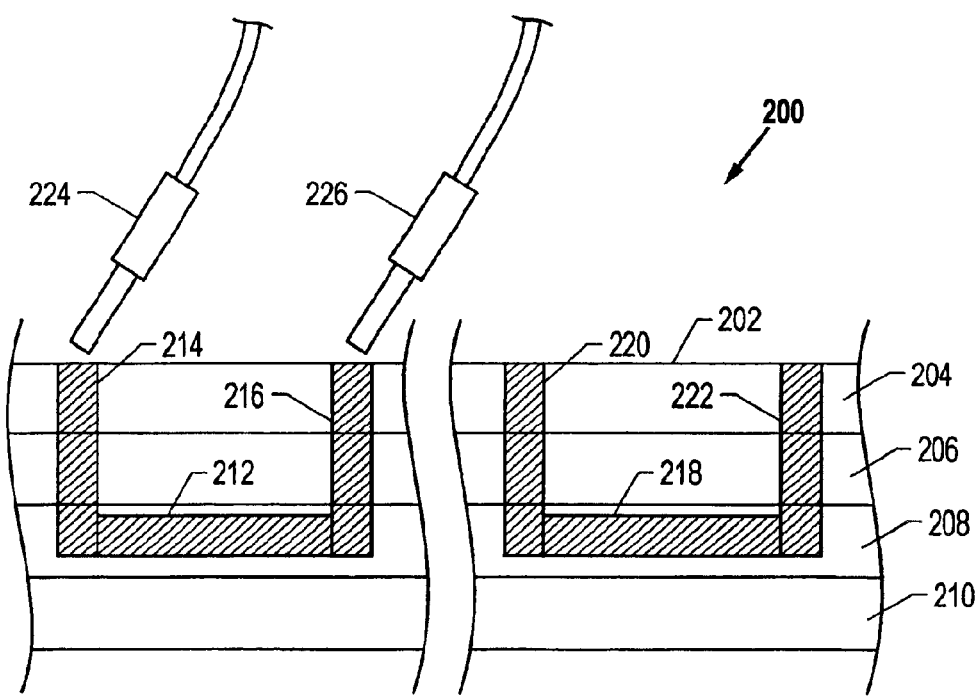
FIG. 2 depicts a schematic diagram of a pair of probes for measuring scattering parameters of a stripline via plated through holes (PTHs)

FIG. 2 depicts a system 200 for the measuring of scattering parameters in a substrate which is illustrated as PCB 202, which includes strata 204, 206, 208, and 210 formed of a fire-resistant cured heterogeneous material which may comprise a composition of glass strands and resin binder. In one embodiment, the PCB 202 may be a fire retardant (FR)-4 material of any grade, such as Nelco 4000-6, 4000-13, or 4000-13 SI, for example. Stripline 212 is positioned in the layer 208 and PTHs 214 and 216 provide surface contacts for the stripline 212. Similarly, stripline 218 is positioned in the layer 208 and PTHs 220 and 222 provide surface contacts for the stripline 218. It should be appreciated that although PTHs are depicted in FIG. 2, other types of connectors may be employed such as subminiature version A (SMA) connectors. As illustrated, the striplines 212 and 218 are positioned within the same layer of the PCB 202 and have substantially identical cross-sections, but have different lengths, e.g., stripline 218 is longer than stripline 212. It should be further appreciated that although the line is described as a stripline, other types of transmission lines, including non-embedded conductors such as microstrips, for example, may be selected for the determination of dielectric properties of the substrate.

Once the network analyzer is calibrated, probes 224 and 226 are coupled to PTHs 214 and 216, respectively, in order to perform in-situ scattering measurements of the PCB 202. For the purposes of measurements and calculations, the stripline 212 and its PTHs 214 and 216 are considered as a uniform transmission line which is attached to connectors with unknown or not easily extractable electrical characteristics. This arrangement is modeled as a cascade representation of a uniform transmission line between two connectors for the length, l, of stripline 212 (see, for example, Janezic, M. D., and J. A. Jargon, "Complex Permittivity Determination from Propagation Constant Measurements," *IEEE Microwave and Guided Letters*, vol. 9, no. 2 (1999), pp. 76–78), which may be described by the following equation:

$$M^1 = XT^1Y, \text{ wherein}$$

$M^1$ is the scattering cascade matrix, i.e., a square array of numbers consisting of the transmission and reflection coefficients associated with the two connectors, i.e., PTHs 214 and 216, and the transmission line, i.e., stripline 212;

X and Y represent the connections PTH 214 and 216, respectively, from the calibrated plane of the network analyzer to the stripline 212; and $T^1$ represents the homogenous transmission line, i.e., stripline 212.

As will be described in more detail hereinbelow, by collecting in-situ scattering parameter measurements of the PCB, utilizing a cascade representation of uniform transmission through the conductor line, e.g., the stripline, a complex propagation constant may be computed for the line conductor, which will be employed by the network analyzer to determine the dielectric properties associated with the substrate. Accordingly, it should be appreciated that the scheme described herein enables the determination of the dielectric properties of post-assembly substrates without destroying the substrate. Moreover, this scheme employs embedded transmission lines and does not necessarily rely on any explicit modeling of launch points, e.g., PTHs. Further, it will be seen below that the teachings described herein permit the differentiation between conductor and dielectric losses, after taking into account such higher-order effects as the skin effect.

Figure 3:
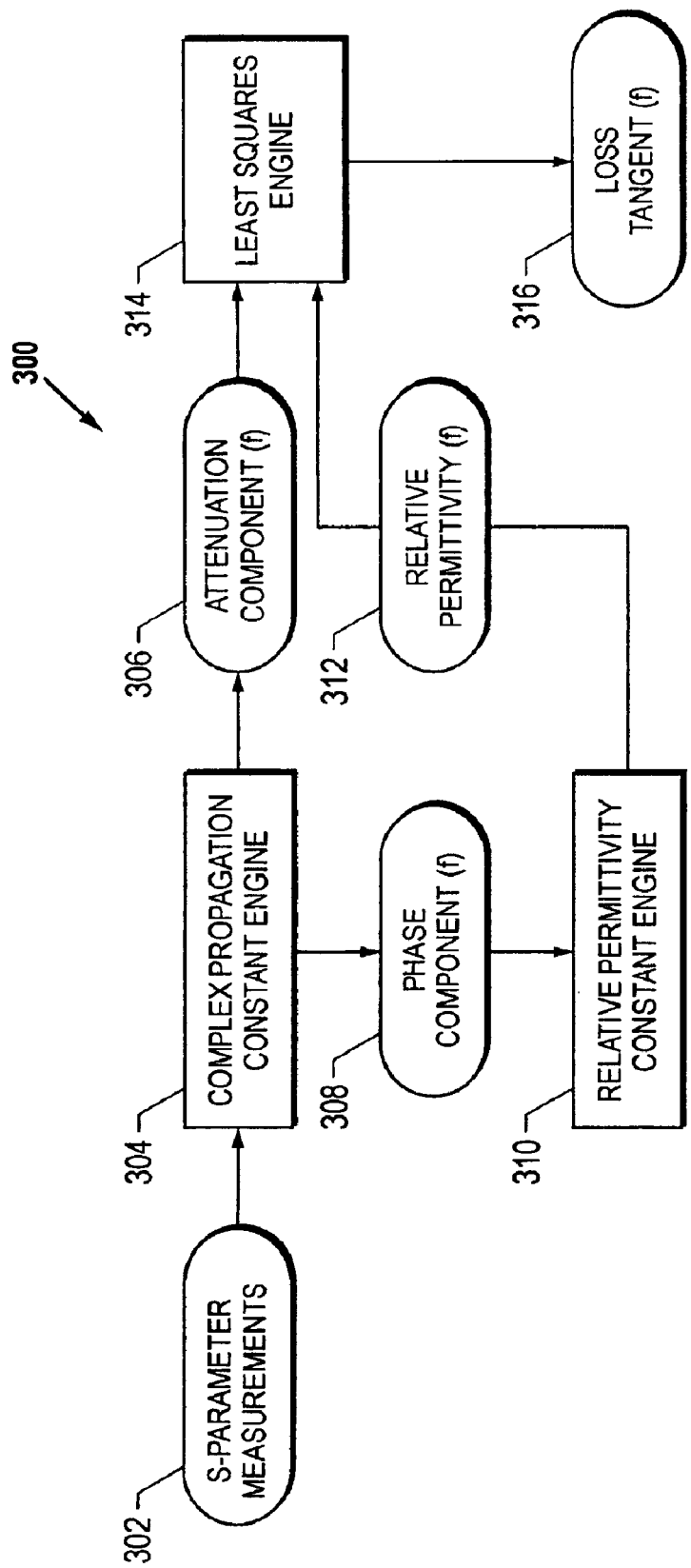
FIG. 3 depicts a functional block diagram of one embodiment of a system for determining the dielectric properties associated with a substrate.

FIG. 3 depicts a functional block diagram of one embodiment of a system 300 for determining the dielectric properties associated with a substrate. Scattering parameter (S-parameter) measurements 302 for at least two lines of substantially identical cross-section embedded within the substrate over a specified frequency range are provided to a complex propagation constant engine 304, i.e., a first engine. In one embodiment, the frequency range is from about 300 KHz to about 8.5 GHz. The complex propagation constant engine 304 determines a complex propagation constant based on the scattering parameters using the cascade representation of a uniform transmission line described hereinabove. In particular, as will be evident to those skilled in the art, the complex propagation constant of a uniform transmission line is determined by "de-embedding" the connection points that are attached to it. The complex propagation constant engine 304 then defines the complex propagation constant in terms of an attenuation component 306 and a phase component 308, both of which are frequency dependent, i.e., in terms of a real part and an imaginary part. More specifically, the complex propagation constant, γ, which varies as a function of frequency, is defined as follows:

$$\gamma(f) = \alpha(f) + j\beta(f), \text{ wherein}$$

α(f) is the frequency dependent attenuation component (i.e., the real part); and jβ(f) is the phase component, which is the frequency dependent imaginary portion of γ(f).

A relative permittivity constant engine 310, i.e., a second engine, responsive to the phase component 308, determines the relative permittivity 312 associated with the substrate over the specified frequency range. More specifically, the phase component, β(f), may defined as follows:

$$\beta(f) = [\omega\sqrt{\epsilon'_r}]/c, \text{ wherein}$$

ω is the angular frequency;

c is the speed of light, i.e., approximately $2.998 \times 10^8$ m/s; and $\epsilon'_r$ is the relative permittivity of the substrate.

By defining the complex propagation constant in terms of the attenuation component 306 and the phase component 308, the relative permittivity may be determined as a function of the frequency since the speed of light and the phase component are known.

A least squares engine 314, i.e., a third engine, responsive to the attenuation component 306 and the relative permittivity 312, performs a least squares analysis to determine the loss tangent associated with the substrate over the specified frequency range. More specifically, the attenuation component, α, may be decomposed into attenuation attributable to the conductor and attenuation attributable to the substrate as illustrated by the following equation:

$$\alpha = \alpha_c + \alpha_d, \text{ wherein}$$

$\alpha_c$ is the attenuation attributable to the conductor, i.e., the stripline or microstrip; and $\alpha_d$ is the attenuation attributable to the dielectric material.

The attenuation attributable to the conductor, $\alpha_c$, may be further defined in terms of the line resistance and the skin effect, which is the tendency of alternating currents to flow near the surface of a conductor thus being restricted to a small part of the total sectional area and producing the effect of increasing the resistance, as follows:

$$\alpha_c = [R_{dc} + R_s \sqrt{f}]/2Z_0, \text{ wherein}$$

$R_{dc}$ is the line resistance;

$R_s$ is the resistance due to the skin effect; and $Z_0$ is the characteristic impedance.

By utilizing this model, the least squares engines 314 may determine the attenuation attributable to the conductor, $\alpha_c$, since the line resistance, $R_{dc}$, the resistance due to the skin effect, $R_s$, and the characteristic impedance, $Z_0$, are constants. The attenuation attributable to the attributable to the dielectric material, $\alpha_d$, may further be defined in terms of relative permittivity and the loss tangent as follows:

$$\alpha_d = [\pi f/c](\tan \delta)\sqrt{\epsilon'_r}$$

As the line resistance, $R_{dc}$, and the resistance due to the skin effect, $R_s$, can be treated as constant parameters and, at low frequencies, the loss tangent, $\tan \delta$, is nearly constant, the attenuation component, α, may be written in terms of the attenuation attributable to the conductor, $\alpha_c$, and the attenuation attributable to the dielectric material, $\alpha_d$, as a polynomial function such that:

$$\alpha = [\tfrac{1}{2}Z_0]R_{dc} + [\tfrac{1}{2}Z_0]R_s\sqrt{f} + [\pi/c](\tan \delta)\sqrt{e} + e, \text{fra} + ee \; \epsilon'_r \cdot f,$$

wherein $[\tfrac{1}{2}Z_0]R_{dc}$; $[\tfrac{1}{2}Z_0]R_s$; and $[\pi/c](\tan \delta)\sqrt{\epsilon'_r}$ are constants.

From this equation, a least squares model may be set up as follows:

X(f)=[1 √f f]

b=(x'x)⁻¹x'α, b=[$R_{dc}/2Z_0$ $R_s/2Z_0$ constant]

Since $\alpha_c$ is known, all other quantities may be determined. In particular, the loss tangent, $\tan \delta$, may be determined, which in turn can be employed in further calculations such as determining the substrate's complex dielectric constant.

Figure 4:
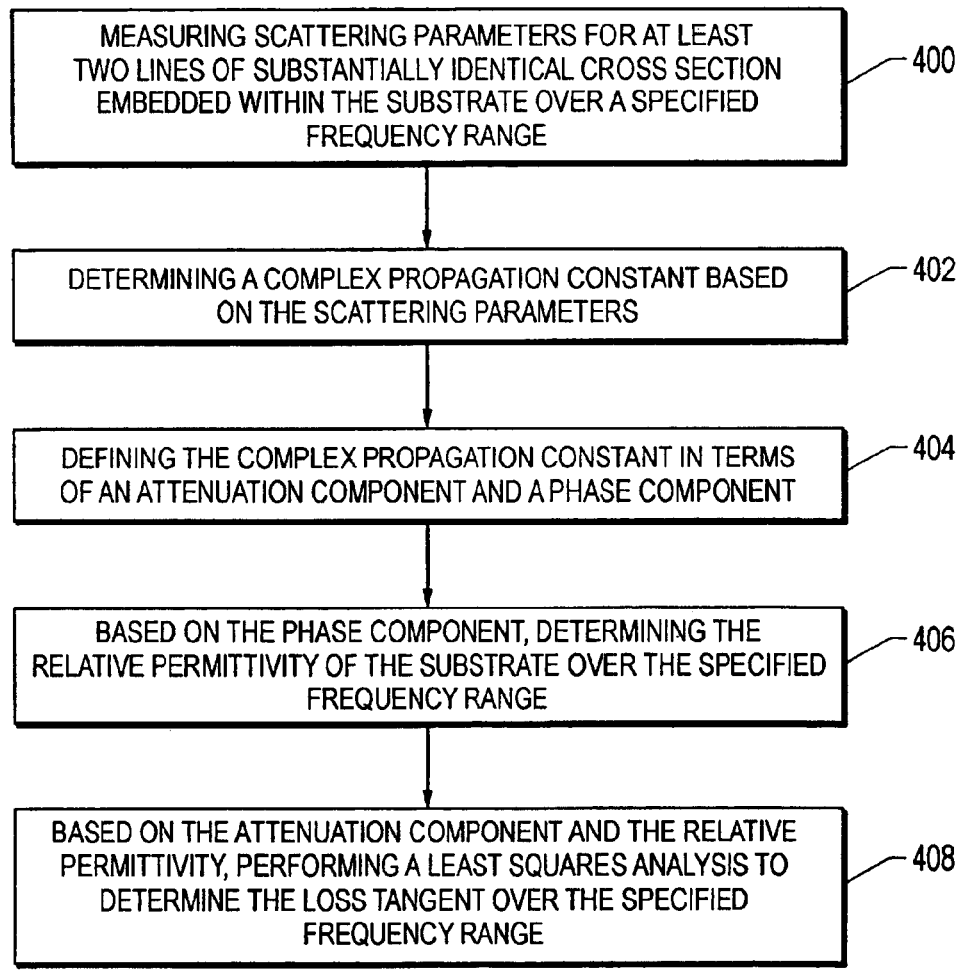
FIG. 4 depicts a flow chart of one embodiment of a method for determining the dielectric properties associated with a substrate.

FIG. 4 depicts a flow chart of one embodiment of a method for determining the dielectric properties such as the loss tangent associated with a substrate. At block 400, scattering parameters are measured for at least two lines of substantially identical cross-section embedded within the substrate over a specified frequency range. In one implementation, the range is from about 300 KHz to about 8.5 GHz. Additionally, in a further embodiment, the methodology measures scattering parameters for two transmission lines that have similar launch points, e.g., both have SMA connectors, and different lengths. At block 402, a complex propagation constant is defined based on the scattering parameters. At block 404, the complex propagation constant is defined in terms of an attenuation component and a phase component. At block 406, based on the phase component, the relative permittivity associated with the substrate over the specified frequency range is determined. At block 408, based on the attenuation component and the relative permittivity, a least squares analysis is performed to determine the loss tangent associated with the substrate over the specified frequency range wherein the conductor and dielectric losses are differentiated. Accordingly, this methodology may be employed in conjunction with any test vehicle for monitoring material properties of composite substrates. For example, the instant methodology presented herein may be employed for PCBs, chip packages, or silicon, for example. Furthermore, the various engines that may be utilized for determining the dielectric properties of the material can be implemented in software, hardware, firmware, or any combination thereof supported by a computer environment such as the system shown in FIG. 1.

In an experimental verification of the teachings presented herein, three boards were produced with the following specifications:

five striplines of 2", 4", 12", and 20" in length;

three types of FR4: Nelco 4000-6, 4000-13, and 4000-13 SI;

all striplines routed on the same layer; and

SMA connectors.

The cross-sectional specifications for stripline width, w, substrate dielectric thickness, h, and stripline thickness, t, for the three boards are presented in the following table, Table 1.

TABLE 1

| | Cross-Sectional Specifications | | |
|---|---|---|---|
| Material | w | h | t |
| 4000-6 | 584 μm (23 mils) | 660 μm (26 mils) | 35.6 μm (1.4 mils) |
| 4000-13 | 584 μm (23 mils) | 533 μm (21 mils) | 35.6 μm (1.4 mils) |
| 4000-13 SI | 584 μm (23 mils) | 521 μm (20.5 mils) | 35.6 μm (1.4 mils) |

Figure 5:
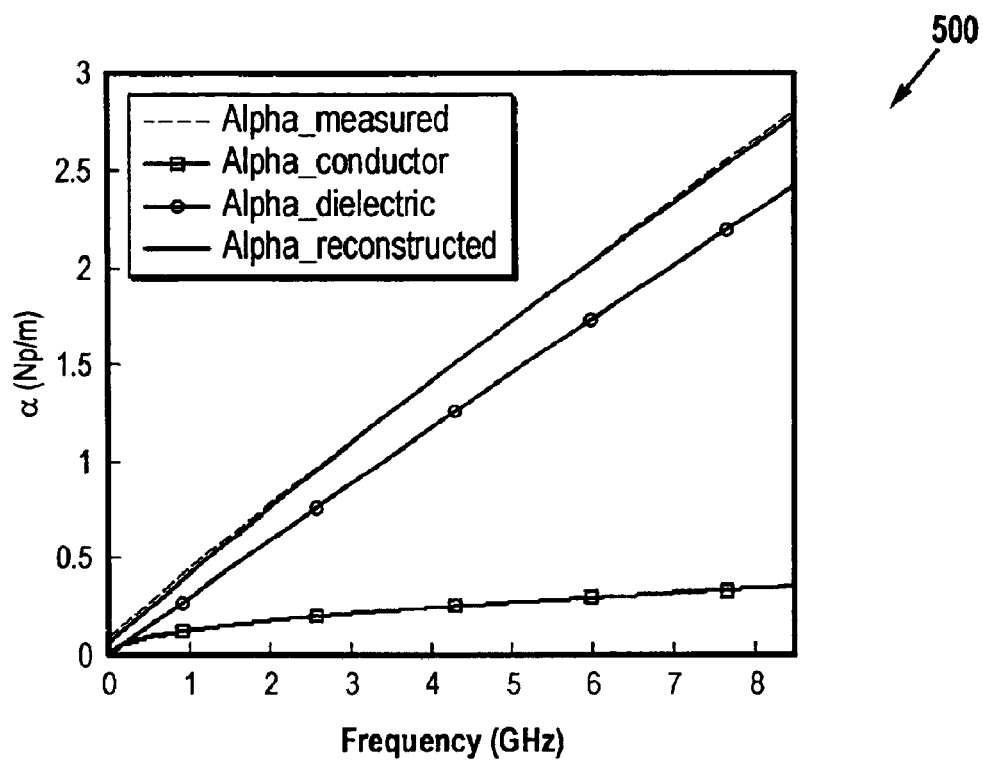
FIG. 5 depicts a graph of attenuation component as a function of frequency.

FIG. 5 depicts a graph 500 of attenuation component, α, as a function of frequency for the PCB produced with the aforementioned Nelco 4000-6 material. As expected, the contribution of dielectric loss to the attenuation component is linear with frequency and that of conductor loss is proportional to the square root of frequency, f. Additionally, the agreement between the measured and reconstructed values of the attenuation component, α, is very good. This indicates that the assumptions used for fitting the data according to the least squares model are indeed valid.

Figure 6:
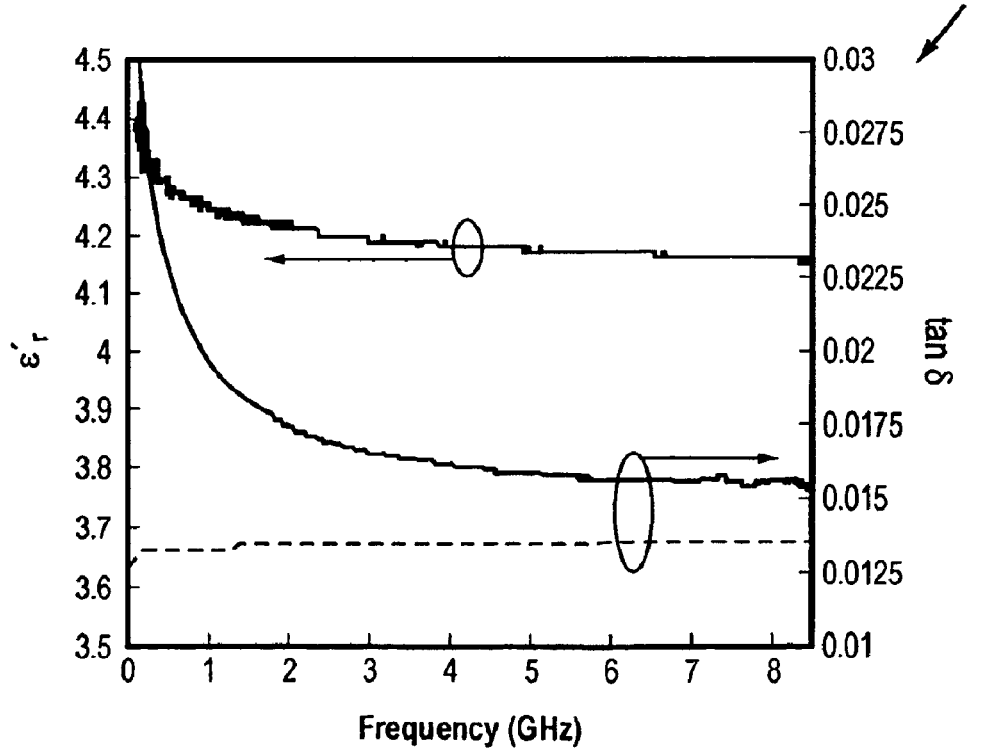
FIG. 6 depicts a graph of relative permittivity and loss tangent as a function of frequency.

FIG. 6 depicts a graph 600 of the relative permittivity, $\epsilon'_r$, and loss tangent, $\tan \delta$, as a function of frequency for the PCB constructed with the 4000-6 material. In particular, the graph 600 illustrates cases for when the contribution of conductor losses are removed from the total losses and when they are not. As illustrated in graph 600, when the skin effect losses are not subtracted from the total losses, the measurement of the loss tangent, $\tan \delta$, is much higher and also presents frequency characteristics, which could only follow a Kramers-Kronig relationship if the material under test, i.e., the Nelco 4000-6 material, was a conductor (which is not the case). Additionally, graph 600 illustrates that the loss tangent, $\tan \delta$, is fairly constant over a wide range of frequencies, which further validates the systems and methods described herein. As a further demonstration of the effectiveness of the teachings presented herein, it is interesting to note from FIG. 6 that the value of loss tangent for the PCB constructed with the Nelco 4000-6 is around 0.02 at 1 GHz, which is the quoted value provided from the manufacturer of the Nelco 4000-6 material.

Figure 7:
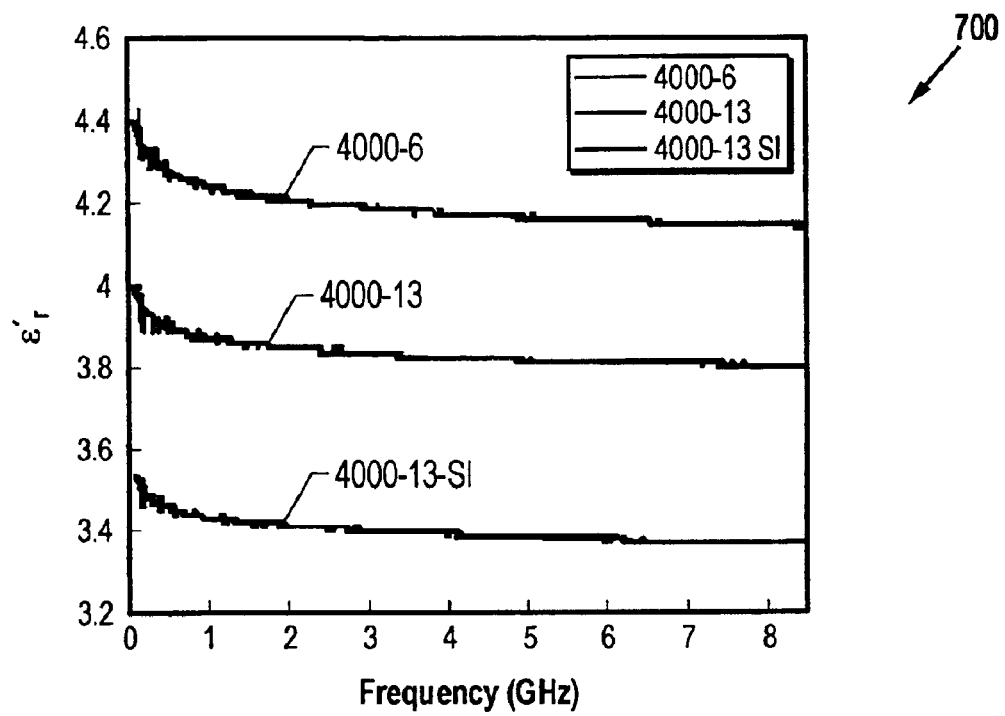
FIG. 7 depicts a graph of relative permittivity as a function of frequency for several types of FR4-based printed circuit boards (PCBs)
Figure 8:
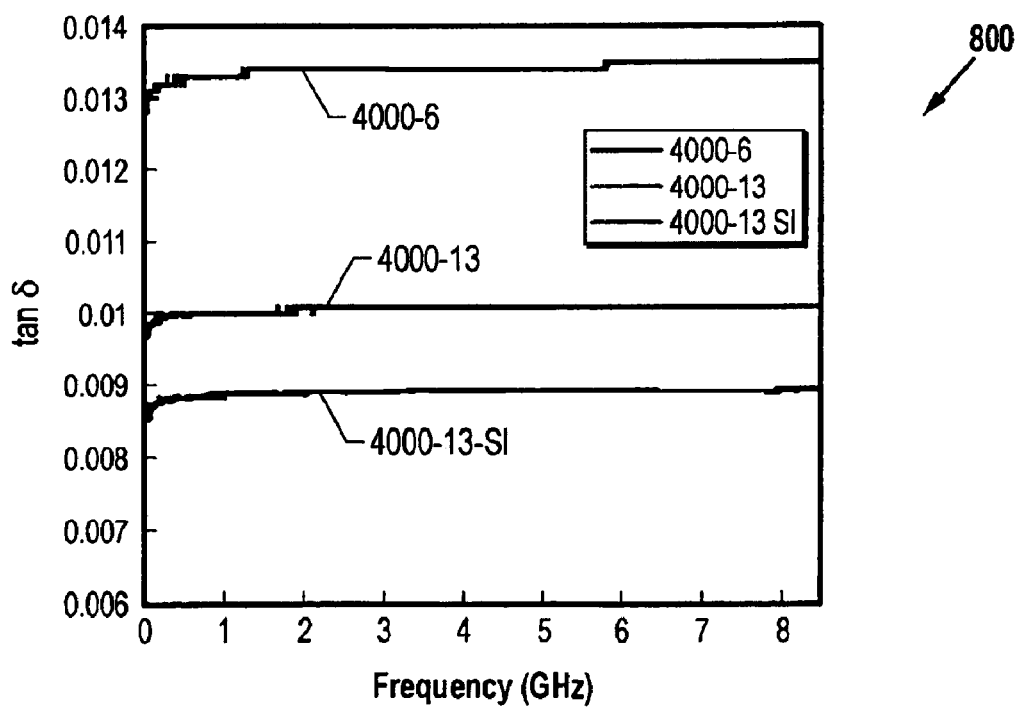
FIG. 8 depicts a graph of loss tangent as a function of frequency for several types of FR4 PCBs.

FIG. 7 depicts a graph 700 of relative permittivity as a function of frequency for the three types of FR4 PCBs. Similarly, FIG. 8 depicts a graph 800 of loss tangent as a function of frequency for the same three boards. As illustrated, with reference to FIGS. 7 and 8, for frequencies below 1 GHz, the variation of $\epsilon'_r$ as a function of frequency exhibits behaviors that are similar to the observed tan δ, when the effect of conductor losses was not included as part of the loss mechanism. In the frequencies of interest for high speed system links, i.e., greater than 1 GHz, the error is minimal as the contribution of internal inductance is very small. In this region, the variation of $\epsilon'_r$ as a function of frequency is almost constant.

Accordingly, a simple but accurate method for determining the complex permittivity and associated values of PCB materials has been presented that employs a specific formulation for determining the complex propagation constant of a uniform transmission line by de-embedding the connection points that are attached to it. By modeling the physical behaviors of dielectric materials and conductors, the conductor and dielectric losses are separated from each other. This permits the extraction of relative permittivity and loss tangent of a variety of substrates, including composite substrate materials.

Although the invention has been particularly described with reference to certain illustrations, it is to be understood that the forms of the invention shown and described are to be treated as exemplary embodiments only. Various changes, substitutions and modifications can be realized without departing from the spirit and scope of the invention as defined by the appended claims.

What is claimed is:

1. A system for determining a dielectric property associated with a substrate, comprising:
   a network analyzer for measuring scattering parameters for at least two lines of substantially identical cross-section embedded within said substrate over a specified frequency range;
   a first engine for determining a complex propagation constant based on said scattering parameters and defining said complex propagation constant in terms of an attenuation component and a phase component;
   a second engine, responsive to said phase component, for determining a relative permittivity parameter associated with said substrate over said specified frequency range; and
   a third engine, responsive to said attenuation component and said relative permittivity parameter, for performing a least squares analysis to determine a loss tangent parameter associated with said substrate over said specified frequency range.

2. The system as recited in claim 1, wherein said specified frequency range comprises a range from about 300 KHz to about 8.5 GHz.

3. The system as recited in claim 1, wherein said at least two lines of identical cross-section comprise striplines of varying lengths.

4. The system as recited in claim 1, wherein said at least two lines of identical cross-section comprise microstrips of varying lengths.

5. The system as recited in claim 1, wherein said network analyzer comprises two probes that contact one of said at least two lines of substantially identical cross-section via platted through holes (PTHs) coupled to said one of said at least two lines.

6. The system as recited in claim 1, wherein said network analyzer comprises two probes that contact one of said at least two lines of substantially identical cross-section via subminiature version A (SMA) connections coupled to said one of said at least two lines.

7. The system as recited in claim 1, wherein said loss tangent parameter is utilized in determining said substrate's dielectric constant.

8. The system as recited in claim 1, wherein said complex propagation constant is determined for a substrate comprising a printed circuit board (PCB).

9. The system as recited in claim 1, wherein said complex propagation constant is determined for a substrate comprising a fire retardant (FR)-4 material.

10. A method for determining a dielectric property associated with a substrate, comprising:
    measuring scattering parameters for at least two lines of substantially identical cross-section embedded within said substrate over a specified frequency range;
    determining a complex propagation constant based on said scattering parameters;
    defining said complex propagation constant in terms of an attenuation component and a phase component;
    based on said phase component, determining a relative permittivity parameter associated with said substrate over said specified frequency range; and
    based on said attenuation component and said relative permittivity parameter, performing a least squares analysis to determine a loss tangent parameter associated with said substrate over said specified frequency range.

11. The method as recited in claim 10, wherein the operation of measuring scattering parameters for at least two lines of substantially identical cross-section embedded within said substrate over a specified frequency range further comprises measuring said scattering parameters over a frequency range from about 300 KHz to about 8.5 GHz.

12. The method as recited in claim 10, wherein the operation of measuring scattering parameters for at least two lines of substantially identical cross-section embedded within said substrate over a specified frequency range further comprises selecting said at least two striplines of identical cross-section having varying lengths.

13. The method as recited in claim 10, wherein the operation of measuring scattering parameters for at least two lines of substantially identical cross-section embedded within said substrate over a specified frequency range further comprises selecting at least two microstrips of identical cross-section having varying lengths.

14. The method as recited in claim 10, wherein the operation of measuring scattering parameters for at least two lines of substantially identical cross-section embedded within said substrate over a specified frequency range further comprises probing said at least two lines via platted through holes (PTHs) coupled to said one of said at least two lines.

15. The method as recited in claim 10, wherein the operation of measuring scattering parameters for at least two lines of substantially identical cross-section embedded within said substrate over a specified frequency range further comprises probing said at least two lines via subminiature version A (SMA) connections coupled to said one of said at least two lines.

16. The method as recited in claim 10, further comprising determining said substrate's dielectric constant based on said loss tangent parameter.

17. A system for analyzing a substrate, comprising:

a network analyzer;

first and second probes coupled to said network analyzer, said first and second probes being operable to perform in-situ measurements of scattering parameters for at least two lines of substantially identical cross-section associated with said substrate over a specified frequency range; and means associated with said network analyzer, responsive to said in-situ measurements of scattering parameters, for determining a loss tangent associated with said substrate by utilizing a cascade representation of uniform transmission to model said substrate and a complex propagation constant associated therewith.

18. The system as recited in claim 17, wherein said specified frequency range comprises a range from about 300-KHz to about 8.5 GHz.

19. The system as recited in claim 17, wherein said at least two lines of substantially identical cross-section are selected from the group consisting of striplines and microstrips.

20. The system as recited in claim 17, wherein said means associated with said network analyzer is operable to determine a loss tangent associated with a substrate comprising a printed circuit board (PCB).

21. The system as recited in claim 17, wherein said loss tangent is utilized in determining said substrate's dielectric constant.

22. The system as recited in claim 17, wherein said means associated with said network analyzer is operable to generate a graph of said loss tangent versus frequency over said specified frequency range.

23. The system as recited in claim 17, wherein said means associated with said network analyzer is operable to generate a graph of relative permittivity versus frequency over said specified frequency range.

\* \* \* \* \*